US006367252B1

(12) United States Patent
Hill et al.

(10) Patent No.: US 6,367,252 B1
(45) Date of Patent: Apr. 9, 2002

(54) MICROELECTROMECHANICAL ACTUATORS INCLUDING SINUOUS BEAM STRUCTURES

(75) Inventors: Edward A. Hill, Chapel Hill; Vijayakumar Rudrappa Dhuler, Raleigh; Allen Cowen, Morrisville; Ramaswamy Mahadevan, Chapel Hill; Robert L. Wood, Cary, all of NC (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/610,047

(22) Filed: Jul. 5, 2000

(51) Int. Cl.$^7$ ................................................ F01B 29/10
(52) U.S. Cl. ........................... 60/528; 60/527; 310/306; 310/307
(58) Field of Search .................... 60/527, 528; 310/306, 310/307, 309

(56) References Cited

U.S. PATENT DOCUMENTS

| | | | | |
|---|---|---|---|---|
| 5,867,302 A | * | 2/1999 | Fleming | 359/291 |
| 5,955,817 A | | 9/1999 | Dhuler et al. | 310/307 |
| 5,962,949 A | | 10/1999 | Dhuler et al. | 310/307 |
| 5,994,816 A | | 11/1999 | Dhuler et al. | 310/307 |
| 6,023,121 A | | 2/2000 | Dhuler et al. | 310/307 |
| 6,114,794 A | * | 9/2000 | Dhuler et al. | 310/307 |

OTHER PUBLICATIONS

David A. Koester et al., MUMPs™ Design Handbook, Revision 5.0, Published by Cronos Integrated Microsystems, 2000.

* cited by examiner

Primary Examiner—Hoang Nguyen
(74) Attorney, Agent, or Firm—Myers Bigel Sibley & Sajovec (57) ABSTRACT

In embodiments of the present invention, a microelectromechanical actuator includes a beam having respective first and second ends attached to a substrate and a body disposed between the first and second ends having a sinuous shape. The body includes a portion operative to engage a object of actuation and apply a force thereto in a direction perpendicular to the beam responsive to at least one of a compressive force and a tensile force on the beam. The sinuous shape may be sinusoidal, e.g., a shape approximating a single period of a cosine curve or a single period of a sine curve. The beam may be thermally actuated or driven by another actuator. In other embodiments, a rotary actuator includes first and second beams, a respective one of which has first and second ends attached to a substrate and a body disposed between the first and second ends. Each body includes first and second oppositely inflected portions. The bodies of the first and second beams intersect one another at points at which the first and second oppositely inflected portions of the first and second bodies meet. The bodies of the first and second beams are operative to engage the object of actuation and rotate the object of actuation around the point of intersection responsive to at least one of compressive force and tensile force on the first and second beams. Related methods are also described.

58 Claims, 9 Drawing Sheets

MICROELECTROMECHANICAL ACTUATORS INCLUDING SINUOUS BEAM STRUCTURES

FIELD OF THE INVENTION

This invention relates to microelectromechanical systems (MEMS), and more specifically to MEMS actuators.

BACKGROUND OF THE INVENTION

Microelectromechanical systems (MEMS) have been developed as alternatives to conventional electromechanical devices, such as relays, actuators, valves and sensors. MEMS devices are potentially low-cost devices, due to the use of microelectronic fabrication techniques. New functionality also may be provided, because MEMS devices can be much smaller than conventional electromechanical devices.

Many applications of MEMS technology use actuators that include one or more beams that are actuated electrostatically, magnetically, thermally and/or using other forms of energy. Examples of MEMS actuators using thermal arched beam structures are described in U.S. Pat. No. 5,909,078 to Wood et. al., the disclosure of which is hereby incorporated herein by reference. Among the arched beam structures described therein are structures including one or more arched beams that extend between spaced apart supports on a microelectronic substrate and which expand and contract in response to heating and cooling, thereby causing displacement of the arched beam.

Such thermal arched beam structures can be used to provide actuators, relays, sensors, microvalves and other MEMS devices. Examples of thermal arched beam microelectromechanical devices and associated fabrication methods also are described in U.S. Pat. No. 5,955,817 to Dhuler et al. entitled Thermal Arched Beam Microelectromechanical Switching Array; U.S. Pat. No. 5,962,949 to Dhuler et al. entitled Microelectromechanical Positioning Apparatus; U.S. Pat. No. 5,994,816 to Dhuler et al. entitled Thermal Arched Beam Microelectromechanical Devices and Associated Fabrication Methods; U.S. Pat. No. 6,023,121 to Dhuler et al. entitled Thermal Arched Beam Microelectromechanical Structure; and U.S. patent application Ser. No. 09/275,058 to Edward A. Hill, filed Mar. 23, 1999, the disclosures of all of which are hereby incorporated herein by reference in their entirety.

Developments in MEMS technology have led to actuators that offer desirable displacement and force capabilities. However, the displacement, force and/or reliability of such devices may be limited by materials and structural configuration. For example, stress generated in an arched beam actuator may limit the range of displacement and/or force over which the beam may be operated without causing permanent deformation or failure. Performance of MEMS actuators may also be limited by stability considerations. Accordingly, there is an ongoing need for MEMS actuators that may provide increased stability and reliability in comparison to conventional designs.

SUMMARY OF THE INVENTION

According to embodiments of the present invention, a microelectromechanical actuator includes a substrate. A beam has respective first and second ends attached to the substrate and a body disposed between the first and second ends having a sinuous shape. The body includes a portion operative to engage a object of actuation and apply a force thereto in a direction perpendicular to the beam responsive to at least one of a compressive force and a tensile force on the beam. The sinuous shape may be sinusoidal. For example, the sinuous shape may approximate a single period of a cosine curve or a single period of a sine curve. The first and second ends of the beam may be both fixedly attached to the substrate, or at least one of the first and second ends may be attached to the substrate by at least one movable support, such as an actuator beam. According to other embodiments of the present invention, the sinuous shape approximates a bending mode shape of a straight beam. The beam shape may represent, for example, a continuous or piecewise approximation of the bending mode shape.

According to yet other embodiments of the invention, a microelectromechanical actuator includes a substrate and a beam having respective first and second ends attached to the substrate and a body disposed between the first and second ends. The body includes a portion operative to engage a object of actuation and apply a force thereto in a direction perpendicular to the beam responsive to at least one of a compressive force and a tensile force on the beam. The beam is configured such that the body assumes a sinuous shape if freed from the substrate. The sinuous shape may be sinusoidal, e.g., the sinuous shape may be a continuous or piecewise approximation of a sinusoidal curve or of a bending mode of a straight beam.

According to still other embodiments of the present invention, a microelectromechanical rotary actuator includes a beam having first and second ends attached to a substrate and a body disposed between the first and second ends. The body includes first and second oppositely inflected portions meeting at a point between the first and second ends. The body is operative to engage an object of actuation and rotate the object of actuation around the point at which the oppositely inflected portions meet responsive to at least one of a compressive force and a tensile force on the beam. The first and second oppositely inflected portions may be curved. For example, the body may have a sinusoidal shape approximating a period of a sine curve.

In other embodiments of the present invention, a rotary actuator includes first and second beams, a respective one of which has first and second ends attached to a substrate and a body disposed between the first and second ends. Each body includes first and second oppositely inflected portions meeting at a point between the first and second ends. The bodies of the first and second beams intersect one another at the points at which the first and second oppositely inflected portions of the first and second bodies meet. The bodies of the first and second beams are operative to engage the object of actuation and rotate the object of actuation around the point at which the first and second bodies intersect responsive to at least one of compressive force and tensile force on the first and second beams.

According to other embodiments of the present invention, a microstructure comprises a substrate and a sacrificial layer on the substrate. A beam having respective first and second ends attached to the substrate and a sinusoidal body is disposed between the first and second ends and on the sacrificial layer. The sinusoidal body may have, for example, a shape approximating a period of a cosine curve or a period of a sine curve.

In yet other embodiments of the present invention, a microstructure includes a substrate and a sacrificial layer on the substrate. A beam has respective first and second ends attached to the substrate and a body disposed between the first and second ends and on the sacrificial layer. The body has a shape approximating a bending mode shape of a straight beam. The shape of the body may be a substantially continuous or piecewise approximation of the bending mode shape.

According to method aspects of the present invention, a microstructure is fabricated by forming a sacrificial layer on a substrate and forming a beam having respective first and second ends attached to the substrate and a sinusoidal body disposed between the first and second ends and on the sacrificial layer. At least a portion of the sacrificial layer is removed to release the sinusoidal body. The sinusoidal body may, for example, have a shape approximating a period of a cosine curve or a period of a sine curve.

According to yet other method aspects, a microstructure is fabricated by forming a sacrificial layer on a substrate and forming a beam having respective first and second ends attached to the substrate and a body disposed between the first and second ends and disposed on the sacrificial layer, the body having a shape approximating a bending mode shape. The shape of the body may be a substantially continuous or piecewise approximation of the bending mode shape.

According to still other method aspects of the present invention, an object of actuation is rotated by engaging the object of actuation with a beam having first and second ends attached to a substrate and a body disposed between the first and second ends, the body including first and second oppositely inflected portions meeting at a point between the first and second ends. One of a compressive force or a tensile force is applied to the beam to rotate the object of actuation around the point at which the oppositely inflected portions meet. The body of the beam may have a sinusoidal shape, e.g., the body shape may approximate a period of a sine curve or a second bending mode shape of a straight beam. The object of actuation may be engaged with first and second beams, a respective one of which has first and second ends attached to the substrate and a body disposed between the first and second ends, each body including first and second oppositely inflected portions meeting at a point between the first and second ends, wherein the bodies of the first and second beams intersect one another at the points at which the first and second oppositely inflected portions of the first and second bodies meet. Respective compressive or tensile forces may be applied to the first and second beams to rotate the object of actuation around the point at which the first and second bodies intersect.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, thicknesses, displacements and other features may be exaggerated for clarity. Like numbers refer to like elements throughout. It will be understood that when an element such as a layer, region or substrate is referred to as being "on", "connected to" or "coupled to" another element, it can be directly on, directly connected to or directly coupled to the other element, or intervening elements also may be present. In contrast, when an element is referred to as being "directly on", "directly connected to" or "directly coupled to" another element, there are no intervening elements present.

Thermal arched beam (TAB) actuators are described in U.S. Pat. Nos. 5,909,078, 5,962,949, 5,994,816, 5,995,817 and 6,023,121, the disclosures of all of which are hereby incorporated by reference herein in their entirety. Such TABs may be heated by internal and/or external heaters that are coupled to the TAB and/or to the substrate. One or more TABs may also be coupled together and may be supported by one or more pairs of supports. MEMS actuators utilizing driven arched beams are described in a U.S. patent application Ser. No. 09/542,672 to Hill et al. entitled MICROELECTROMECHANICAL ACTUATORS INCLUDING DRIVEN ARCHED BEAMS FOR MECHANICAL ADVANTAGE, filed Apr. 5, 2000 and incorporated by reference herein in its entirety. A driven arched beam can achieve mechanical advantage by using at least one TAB attached to at least one end of the driven beam to compress and/or extend the driven beam. It will be appreciated that the beams described herein may also be thermally actuated, i.e., by expansion or contraction of the beam itself responsive to heating or cooling of the beam, or may be driven by another actuator, such as a TAB.

The MEMS beams described herein may be generally described as including a portion that is "sinuous" in shape. As used herein, a "sinuous" shape is a generally elongate shape having at least two adjacent oppositely inflected portions. Sinuous shapes may include, for example, sinusoidal shapes and quasi-sinusoidal shapes such as piecewise approximations of sinusoidal shapes. Representative sinusoidal shapes include, but are not limited to, shapes having two adjacent oppositely inflected portions that meet at a medial inflection point, e.g., shapes that approximate a period of a sine curve, as well as shapes that have two sets of two adjacent oppositely inflected portions meeting at two respective inflection points, e.g., shapes that approximate a period of a cosine curve.

Figure 1:
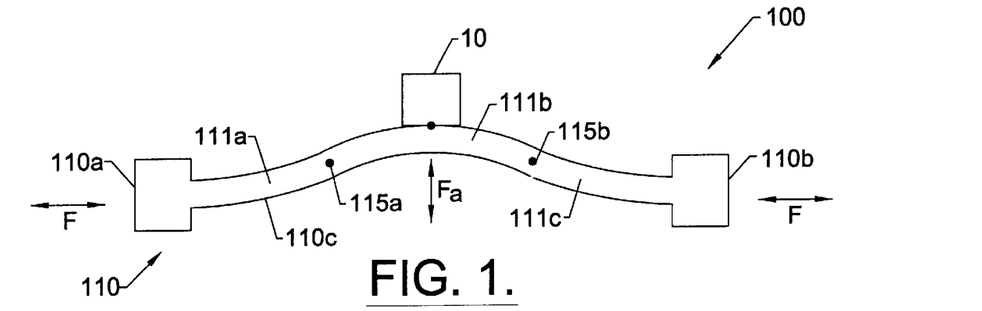
FIGS. 1 and 2 are plan and side views, respectively, of a MEMS actuator with a cosine-shaped beam according to embodiments of the present invention.
Figure 2:
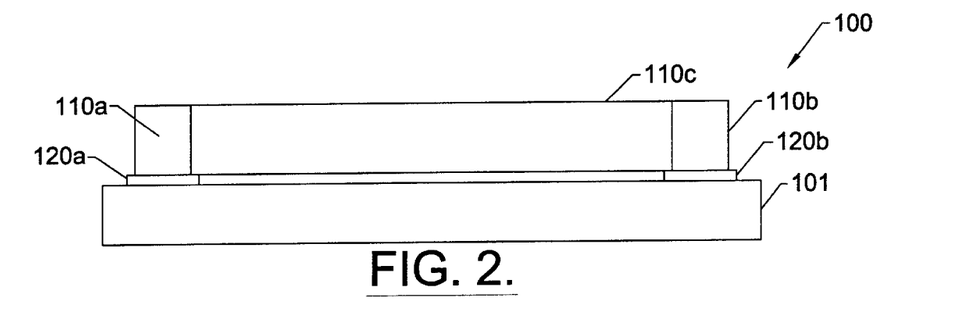

FIGS. 1 and 2 are plan and side views, respectively, of a MEMS actuator 100 according to embodiments of the invention. The actuator 100 includes a beam 110 having first and second ends 110a, 110b and a body 110c. The body 110c includes a first pair of adjacent oppositely inflected portions 111a, 111b that meet a first inflection point 115a and a second pair of adjacent oppositely inflected portions 111b, 111c that meet at a second inflection point 115b. The body 110c maybe described as having a shape that approximates a period of a cosine curve, i.e., a cosine curve in a coordinate frame having an origin at the first end 110a. As illustrated in FIG. 2, the first and second ends 110a, 110b are attached to a microelectronic substrate 101 via fixed supports 120a, 120b such that the body 110c of the beam 110 is free to move with respect to the substrate 101. It will be appreciated that the supports 120a, 120b and the beam 110 may comprise a continuous piece of material, or may be formed as separate structures. The body 110c is operative to engage an object of actuation 10 and to apply a force $F_a$ to the object of actuation 10 that is perpendicular to the beam 110 responsive to a compressive and/or tensile force F applied to the beam 110.

It will be appreciated that the beam 110 may be formed from a variety of different materials. For example, the beam 110 may comprise a conductive material, such as nickel, copper or gold, or a metal alloy such as a nickel-phosphorus alloy. The beam 110 may also be formed of polycrystalline silicon (polysilicon) and/or other non-conductive materials. As illustrated, the beam 110 is fixedly attached to the substrate 101, and is thus suitable for actuation by heating and cooling the beam 110 to generate the compressive and/or tensile force F via expansion and contraction of the beam 110. For such purposes, it may be advantageous to form the beam from nickel or a nickel alloy that exhibits a desirable thermal expansion characteristic. If the beam 110 is heated by passing a current through the beam 110, it may be advantageous to form the beam 110 from a nickel-phosphorus alloy that exhibits relatively high resistivity. The beam 110 may also be heated and/or cooled using an external resistive, semiconductive or other heater and/or cooler placed near or in contact with the beam 110. Multiple cosine-shaped beams, such as the beam 110, may also be arrayed to generate greater force.

It will be appreciated that the object of actuation 10 may comprise a variety of different objects including components of electronic, optic, fluidic and/or other microscopic devices. The components include, but are not limited to, relay contacts, variable capacitor plates, variable resistor contacts, mirrors, optical switches, optical attenuators, and/or microfluidic valve components.

Figure 3:
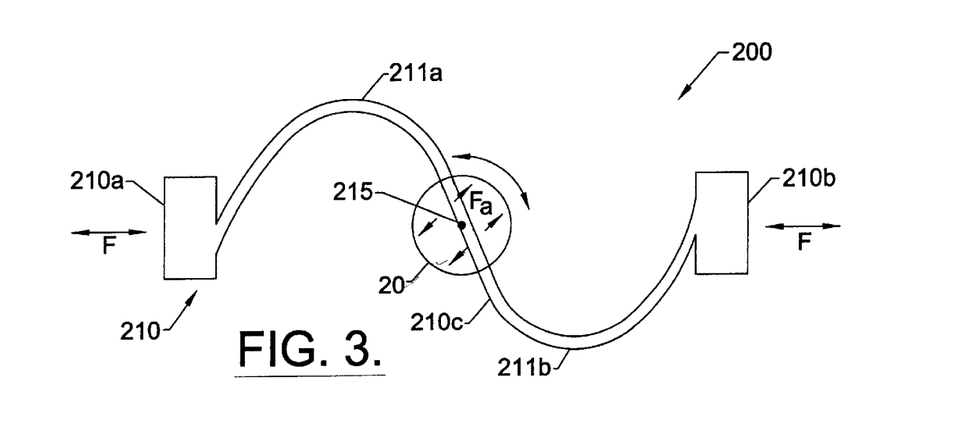
FIGS. 3 and 4 are plan and side views, respectively, of a MEMS rotary actuator with a sine-shaped beam according to embodiments of the present invention.
Figure 4:
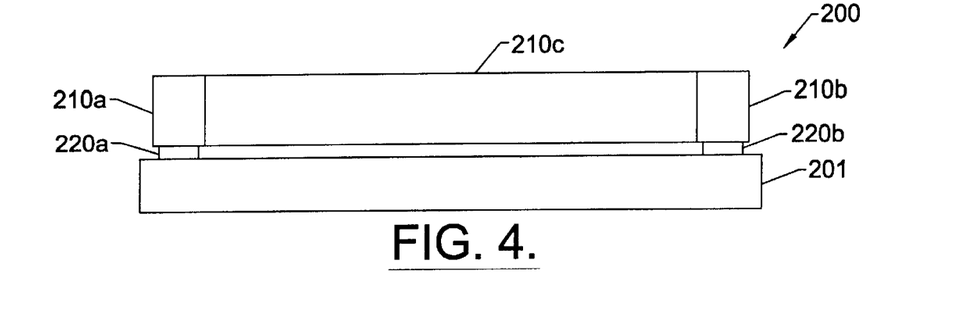

FIGS. 3 and 4 illustrate a MEMS actuator 200 according to other embodiments of the present invention. The actuator 200 includes a beam having first and second ends 210a, 210b and a body 210c having a shape that approximates a period of a sine curve having first and second inflected portions 211a, 221b that meet at a medial inflection point 215. As illustrated in FIG. 4, the first and second ends 210a, 210b are attached to a microelectronic substrate 201 via fixed supports 220a, 220b such that the body 210c of the beam 210 is free to move with respect to the substrate 201. It will be appreciated that the supports 220a, 220b and the beam 210 may comprise a continuous piece of material, or may be formed as separate structures. The body 210c is operative to engage an object of actuation 20, and to apply forces $F_a$ to the object of actuation 20 on first and second sides of the inflection point 215 along respective opposite directions that are perpendicular to the beam 210 responsive to a compressive and/or tensile force F applied to the beam 210. The actuation forces $F_a$ thus cause the object of actuation 20 to rotate about the inflection point 215.

It will be appreciated that the beam 210 may be formed from a variety of different materials. For example, the beam 210 may comprise a conductive material such as nickel, copper or gold, or a metal alloy such as a nickel-phosphorus alloy. The beam 210 may also be formed of polycrystalline silicon (polysilicon) and/or other non-conductive materials. Preferably, the "height" of the beam, i.e., the thickness in a direction perpendicular to the substrate on which the beam is formed, should be greater than its width, i.e., the thickness in a direction parallel to the substrate. In addition, appropriate thickness may vary depending on the material used to form the beam. As illustrated, the beam 210 is fixedly attached to the substrate 201, and is thus suitable for actuation by heating and cooling the beam 210 to generate the compressive and/or tensile force F via expansion and contraction of the beam 210. For such purposes, it may be advantageous to form the beam from nickel or a nickel alloy that exhibits a desirable thermal expansion characteristic. If the beam 210 is heated by passing a current through the beam 210, it may be advantageous to form the beam 210 from a nickel-phosphorus alloy that exhibits relatively high resistivity. It will be appreciated that the beam 210 may be heated and/or cooled using an external resistive, semiconductive or other heater or cooler placed near or in contact with the beam 210.

It will be appreciated that the object of actuation 20 may comprise a variety of different objects including components of electronic, optic, fluidic and/or other microscopic devices. The components include, but are not limited to, relay contacts, variable capacitor plates, variable resistor contacts, mirrors, optical switches, optical attenuators, and/or microfluidic valve components. It will also be appreciated that the beam 210 may engage the object of actuation 20 in a number of different ways. For example, the beam 210 may be fixedly attached to the objection of actuation 20 at or near the inflection point 215. The beam 210 may also engage the object of actuation 20 using a non-fixed arrangement, such as an arrangement of interlocking tabs or other surfaces.

FIGS. 5A–5F illustrate exemplary operations for fabricating a MEMS beam structure according to embodiments of the invention. It will appreciated that a wide variety of materials and fabrication processes may be used with the present invention, including, but not limited to, bulk micromachining processes, surface micromachining processes, and high aspect ratio micromachining processes such as LIGA processes. LIGA and other conventional micromachining processes are known to those skilled in the art. Exemplary micromachining processes are described in MUMPs™ *Design Handbook*, Rev. 5.0, published by Cronos Integrated Microsystems, 2000, available at http://www.memsrus.com/cronos/svcsmumps.html, and incorporated by reference herein in its entirety.

Figure 5A:
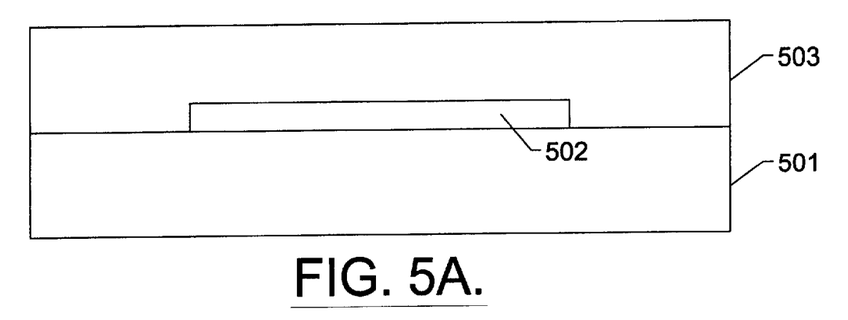
FIGS. 5A–5F are views of fabrication products illustrating exemplary operations for fabricating a MEMS actuator according to embodiments of the present invention.
Figure 5B:
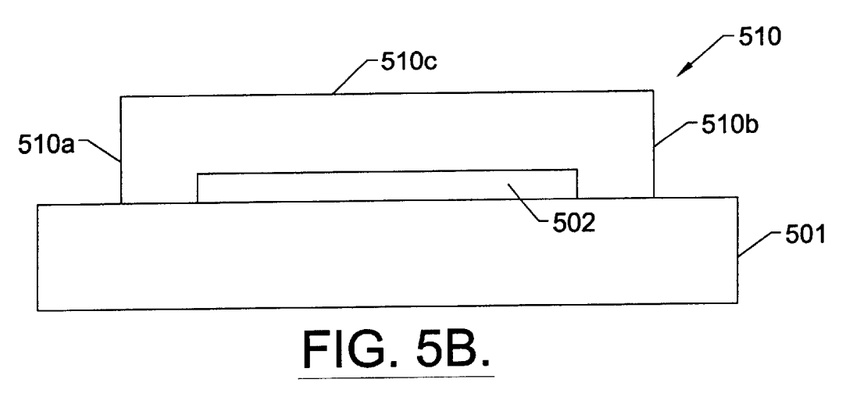
Figure 5C:
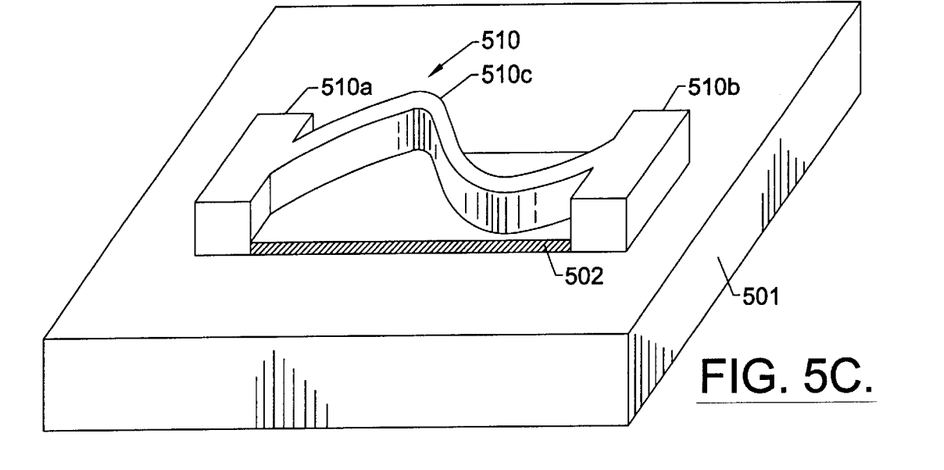
Figure 5D:
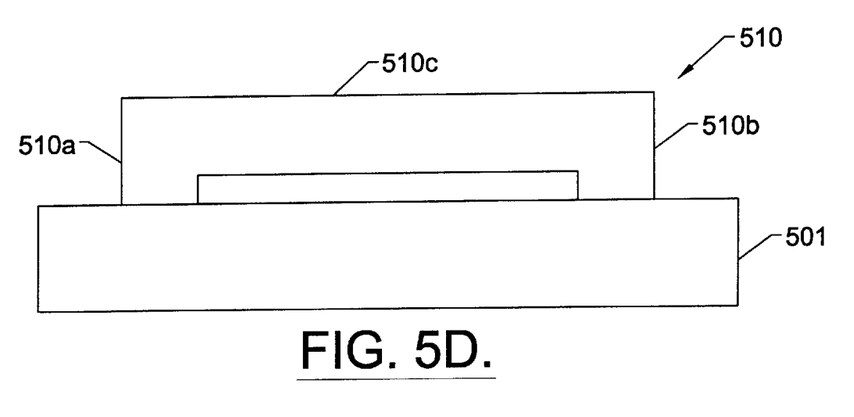

Referring to FIG. 5A, a layer of sacrificial material is formed on a microelectronic substrate 501 and patterned to form a sacrificial layer 502. A beam material layer 503, such as a layer of nickel, copper, gold, nickel alloy, or polysilicon, is then formed on the substrate 501 and the sacrificial layer 502. Referring to FIG. 5B, the beam material layer 503 is patterned to form a beam 510 having first and second ends 510a, 510b and a body 510c that is disposed directly on the sacrificial layer 502. The body 510c has a generally sine curve shape, as illustrated in FIG. 5C. Referring to FIG. 5D, a portion of the sacrificial layer 502 underlying the body 510c of the beam 510 is then removed using, for example, a wet etching process. In this manner, the body 510c is released from the substrate 501, while the ends 510a, 510b remain attached to the substrate 510.

Figure 5E:
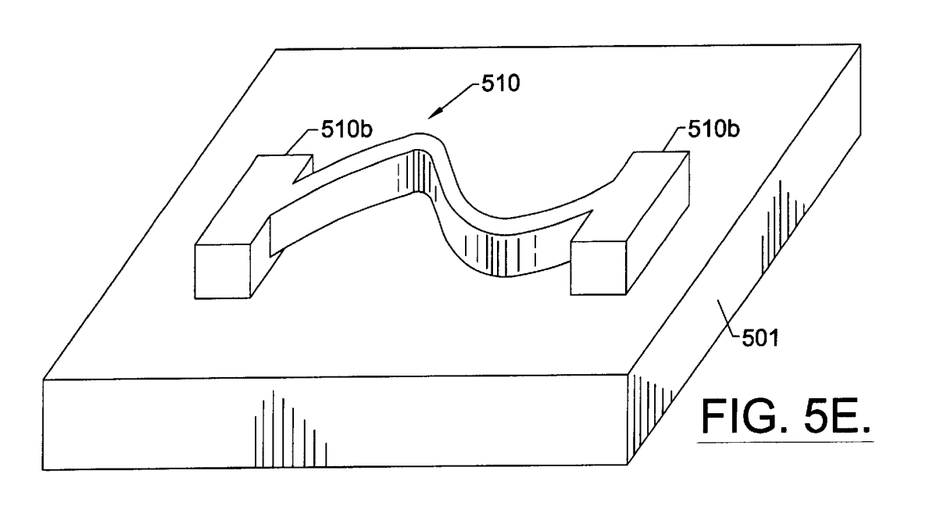
Figure 5F:
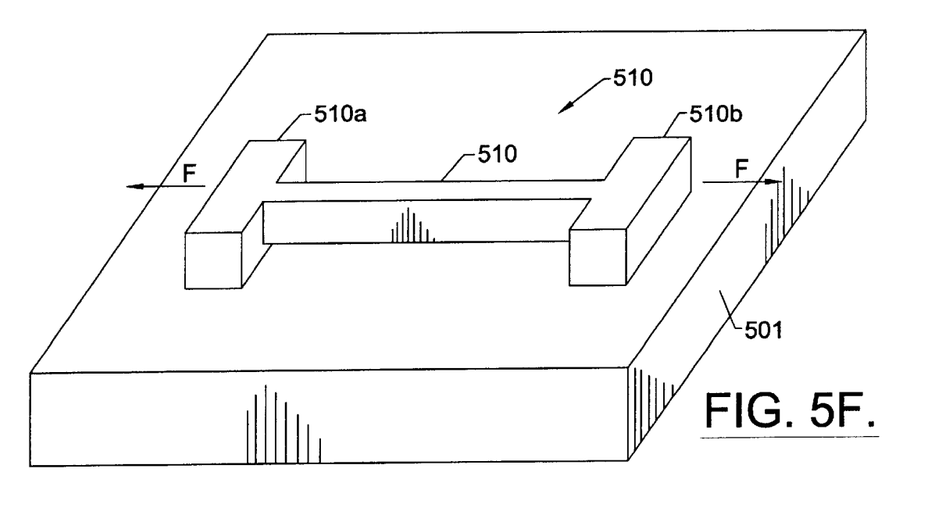

As illustrated in FIG. 5E, upon release from the sacrificial layer 502, the body 510c may retain a sine curve shape. However, depending on compressive or tensile forces applied to the beam 510 by supporting structures and/or ambient conditions, the released body 510c may assume other shapes. For example, as illustrated in FIG. 5F, the body 510c may be deformed into a linear shape by tensile force F applied to the beam 510. It will be appreciated, however, due to the manner in which the beam 510 is fabricated, the beam 510 is configured such that, if one or both of the ends 510a, 510b of the beam 510 are freed from the substrate 501, the beam will tend to reassume its preformed sinusoidal shape.

It will be appreciated that the materials used to form the sacrificial layer 502 and the beam material layer 503 may be selected depending on properties desired for the beam being fabricated. For example, if a relatively large positive coefficient of expansion is desired, nickel or a nickel phosphorus alloy might be used for the beam material layer 503, with the sacrificial layer 502 being formed of a material having desirable etching properties in relation to the beam material. For example, in some applications, the beam material layer 503 may be a metal, such as nickel, or an alloy, such as a nickel phosphorus alloy, it may be desirable to form the sacrificial layer from a metal such as copper and/or titanium. In other applications, the beam material layer 503 may be polysilicon and the sacrificial layer may be formed from phosphosilicate glass (PSG). It will be further appreciated that the operations and fabrication products illustrated in FIGS. 5A–5F are provided for illustrative purposes, and that other techniques may be used with the present invention. For example, different configurations of and techniques for forming the beam material and sacrificial layers may be used.

By way of a theory of operation that is not to be construed as limiting the scope of the present invention, it is believed that the amount of stress induced in a MEMS actuator beam may be lessened by forming the MEMS actuator beam in a shape that approximates a bending mode shape of a straight beam. Simulation results suggest that beams with configurations according to embodiments of the present invention tend to exhibit lower stress for a given amount of force applied to the beam, in comparison to conventional arched beams. Simulation also indicates that threshold stress characteristics, i.e., the level of compressive or tensile force at which a beam exhibits permanent deformation, may be improved with the beam configurations of the present invention. Potential benefits of such reduced stress characteristics include the ability to achieve a given displacement while incurring less beam stress, which may reduced the likelihood of mechanical fatigue and/or failure.

Thus, according to aspects of the present invention, MEMS beams may be viewed as having shapes approximating bending mode shapes of a straight beam. For example, the cosine shaped beam 110 illustrated in FIG. 1 may be viewed as approximating the mode shape of a first bending mode of a straight beam. Similarly, the sine shaped beam 210 illustrated in FIG. 3 may be viewed as approximating the mode shape of a second bending mode of a straight beam.

Figure 6:
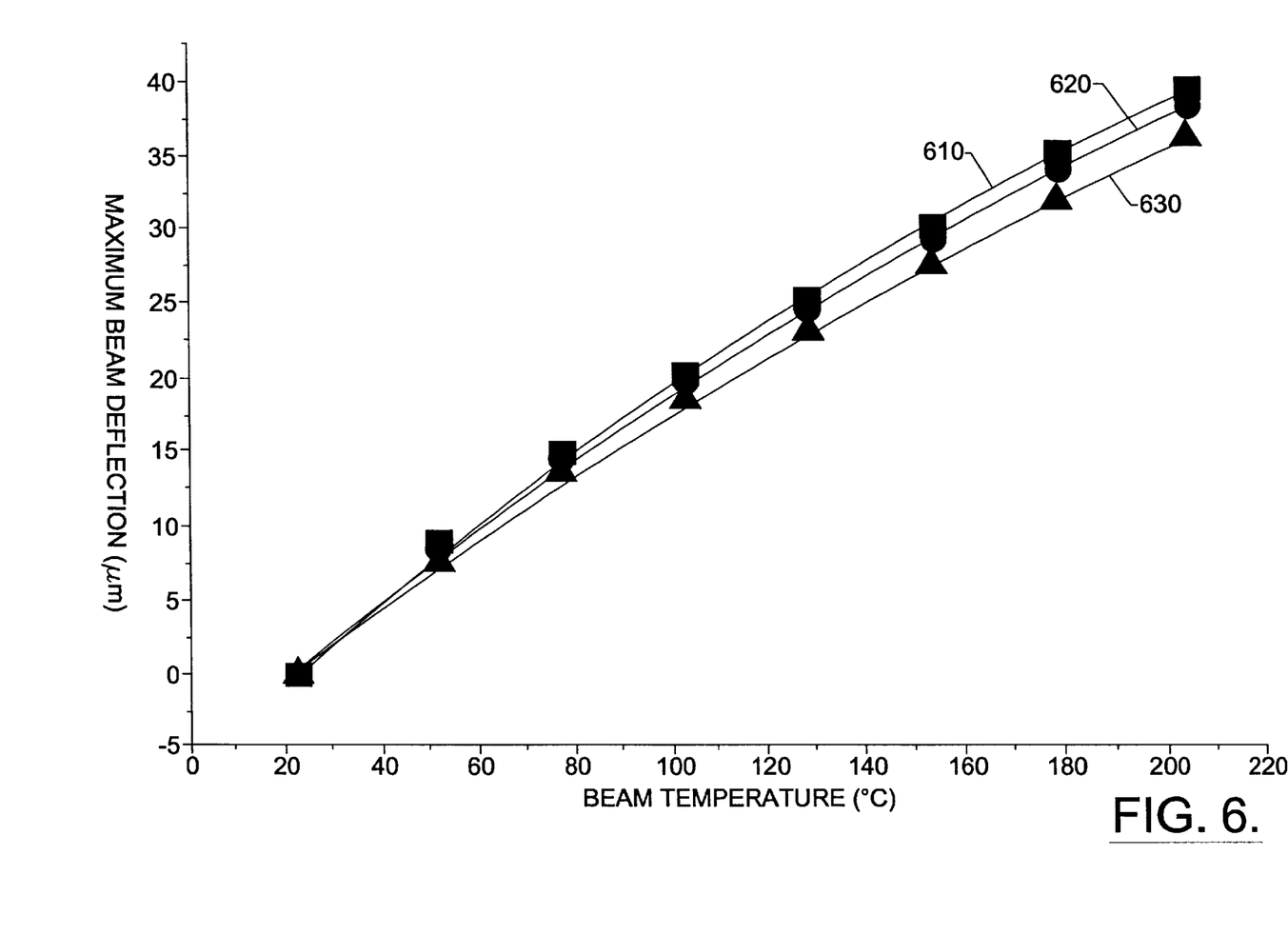
FIGS. 6 and 7 graphically illustrate simulated performance characteristics of a MEMS beam according to embodiments of the present invention in comparison to conventional MEMS beams.
Figure 7:
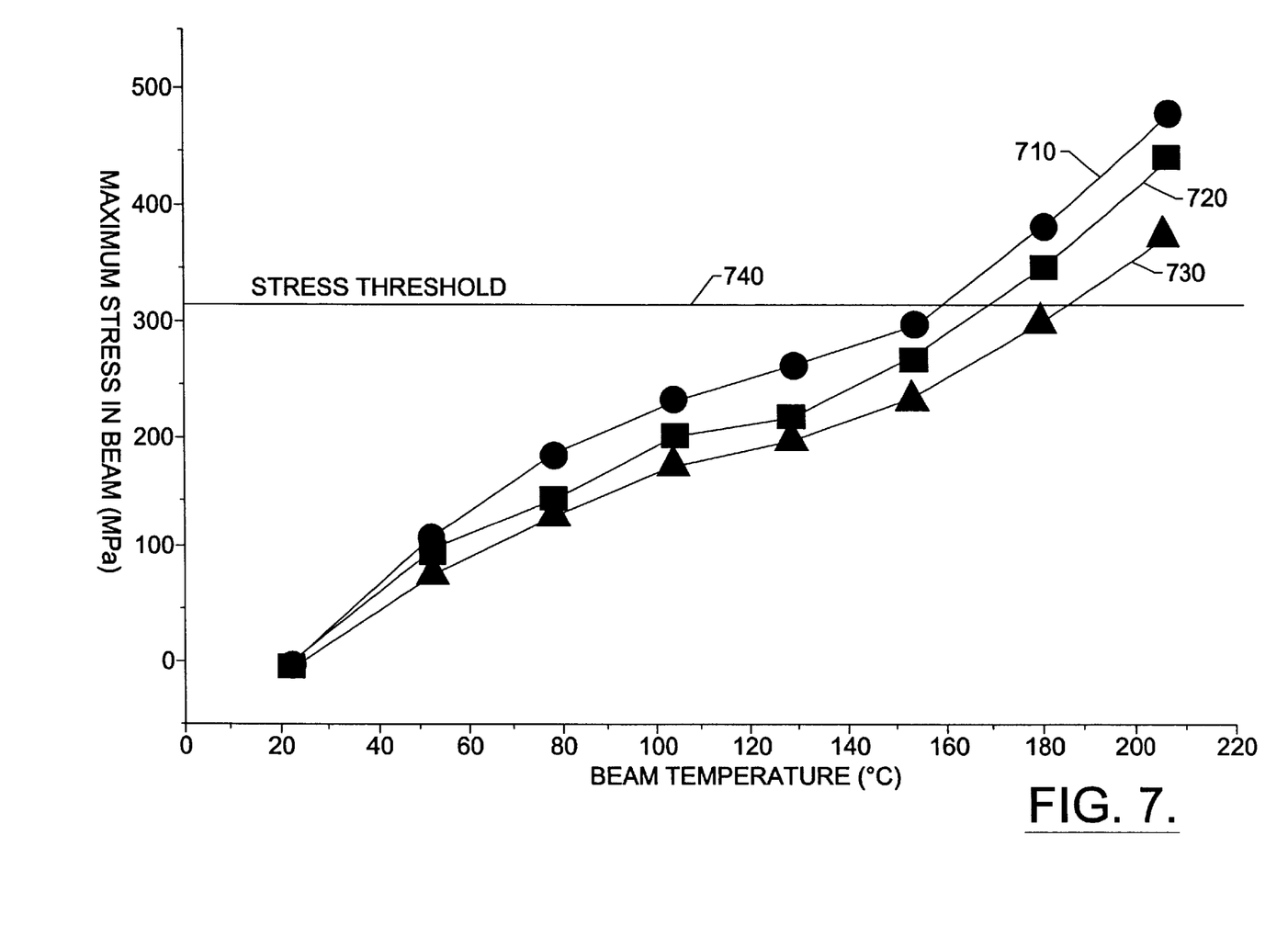

FIGS. 6 and 7 graphically illustrate simulated performance characteristics of thermally actuated nickel beams having conventional arched (circular) and linear (bent) shapes in comparison to simulated performance characteristics of beam having a cosine shape according to embodiments of the present invention. Each of the simulated beams is 1.5 millimeters in length, has a thickness (in a dimension parallel to the substrate) of 10 micron, and a height (layer thickness in a direction perpendicular to the substrate) of 25 microns, with each beam being formed to have an initial displacement of 15 microns in the direction of actuation (i.e., perpendicular to the beam and parallel to the substrate). As indicated by FIG. 6, the displacement vs. temperature characteristics 610, 620, 630 of the circular, linear and cosine beams, respectively, are substantially similar (with the cosine-shaped beam exhibiting slightly less displacement at certain temperatures). However, referring now to FIG. 7, comparison of the stress vs. temperature curve 730 of the simulated cosine shaped beam to the stress vs. temperature curves 710, 720 of the curved and linear beams, respectively, indicates that the cosine shaped beam exhibits less stress, and that permanent deformation, i.e. crossing of a stress threshold 740, occurs at a higher temperature for the cosine-shaped beam than for the other two beams. Based on these observations, it is believed that cosine-shaped beams may be able to achieve a given amount of displacement at relatively lower beam stress levels than comparable conventional arched and linear beams, which may result in a lower likelihood of mechanical fatigue and failure from use of such a beam shape.

Figure 8:
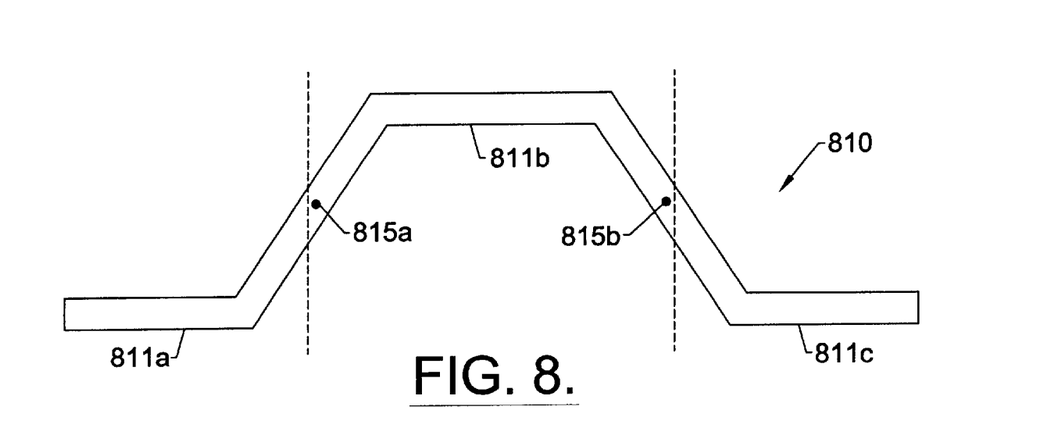
FIGS. 8 and 9 illustrate alternative MEMS actuator beam shapes according to embodiments of the present invention.
Figure 9:
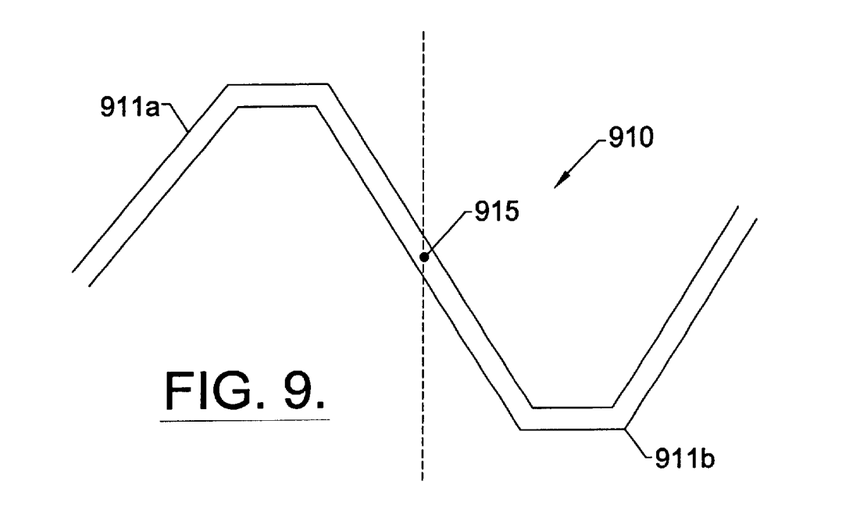

It will be appreciated that beam shapes other than sinusoids are also within the scope of the present invention. For example, in embodiments of the present invention illustrated in FIG. 8, a MEMS actuator beam 810 may have a shape that represents a piecewise approximation of a period of a cosine curve or first bending mode shape. The beam 810 may be characterized in that, similar to the cosine shaped beam 110 of FIG. 1, the beam 810 has adjacent oppositely inflected portions 811a, 811b, 811c that meet at points 815a, 815b. Similarly, as shown in FIG. 9, a MEMS actuator beam 910 may have a shape that represents a piecewise approximation of a period of a sine curve or second bending mode shape. The beam 910 may be characterized in that, similar to the sine shaped beam 210 of FIG. 3, the beam 910 has adjacent oppositely inflected portions 911a, 911b that meet at a point 915. It will be appreciated that other approximations of sinusoids or mode shapes may be used with the present invention, including piecewise approximations formed from curved segments and piecewise linear approximations having a greater number of linear or curved segments than the beams 810, 910 illustrated in FIGS. 8 and 9. Such beams may be fabricated, for example, using techniques similar to those described with reference to FIGS. 5A–5F.

Figure 10:
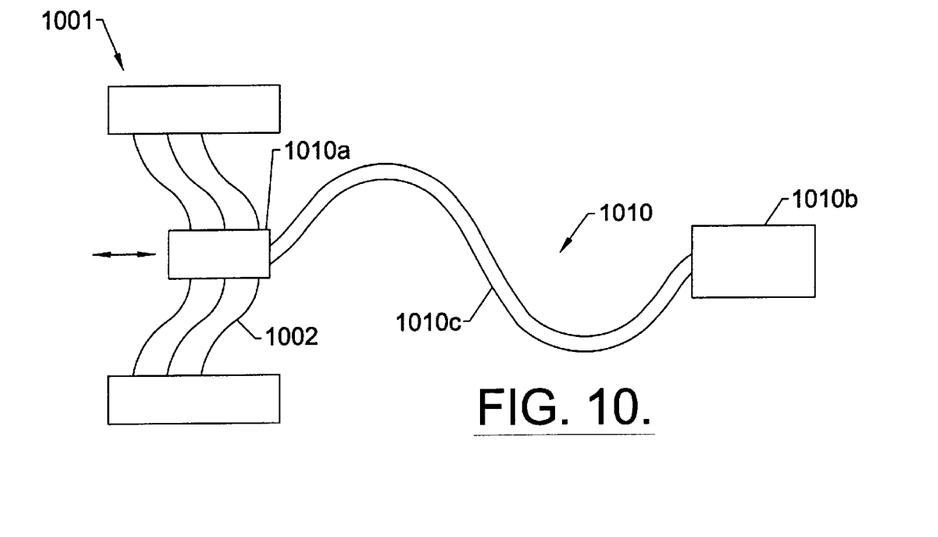
FIGS. 10 and 11 illustrate alternative MEMS beams shapes according to embodiments of the present invention.
Figure 11:
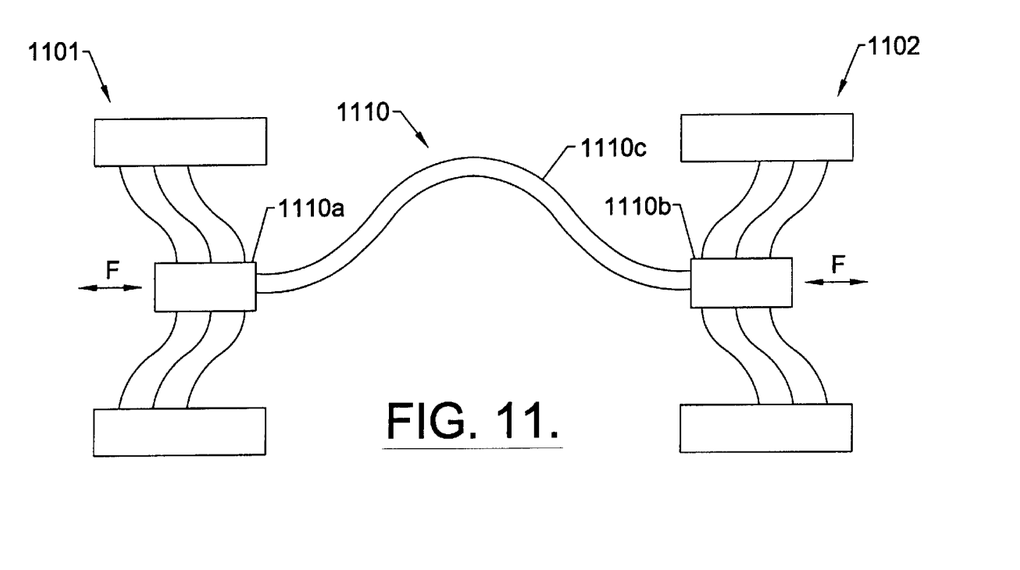

According to other embodiments of the present invention, a sinuous MEMS actuator beam may be attached to a substrate by one or more movable supports that apply compressive and/or tensile force to the beam, instead of being fixedly attached at both ends as shown in FIGS. 1–5F. For example, as shown in FIG. 10, a thermal MEMS actuator 1010 may include an arrayed plurality of cosine shaped, thermally actuated beams 1002 and may engage a first end 1010a of a beam 1010 having a sinuous body 1010c and apply compressive and/or tensile force F to the beam 1010, thus providing mechanical advantage. A second end 1010b of the beam 1010 may be fixedly attached to the substrate. In other embodiments of the present invention illustrated in FIG. 11, compressive and/or tensile force F may be applied by respective thermal MEMS actuators 1101, 1102 that engage respective ends 1110a, 1110b of a beam 1110 having a sinuous body 1110c. Arrangement such as those illustrated in FIGS. 10 and 11 may be used to provide rotation and/or translation of objects operatively engaged with the beams. It will be appreciated that driving structures other than the thermal beam driving structures illustrated in FIGS. 10 and 11 may also be used with the invention. For example, beam driving structures described in the aforementioned U.S. patent application Ser. No. 09/542, 672 to Hill et al. entitled MICROELECTROMECHANICAL ACTUATORS INCLUDING DRIVEN ARCHED BEAMS FOR MECHANICAL ADVANTAGE may be used, as well as other structures that are operative to support ends of a sinuous beam and to apply compressive and/or tensile force thereto.

Figure 12:
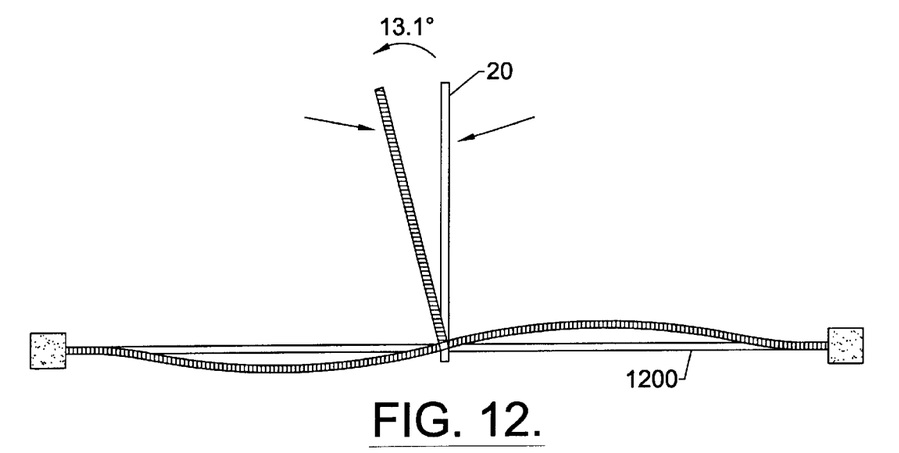
FIGS. 12 and 13 illustrate rotary MEMS actuators according to embodiments of the present invention.

As described above, a sine-shaped beam structure may be particularly useful in implementing a rotary actuator. As illustrated in FIG. 12, a simulated sine-shaped nickel beam 1200 having a length of 1.5 millimeters, a thickness of 10 microns, and a height of 25 microns may achieve a rotation of 13.1 degrees in an object of actuation 20 at 400° C. To increase rotation, the beam 1200 may be driven by another actuator, such as a thermal beam actuator.

Figure 13:
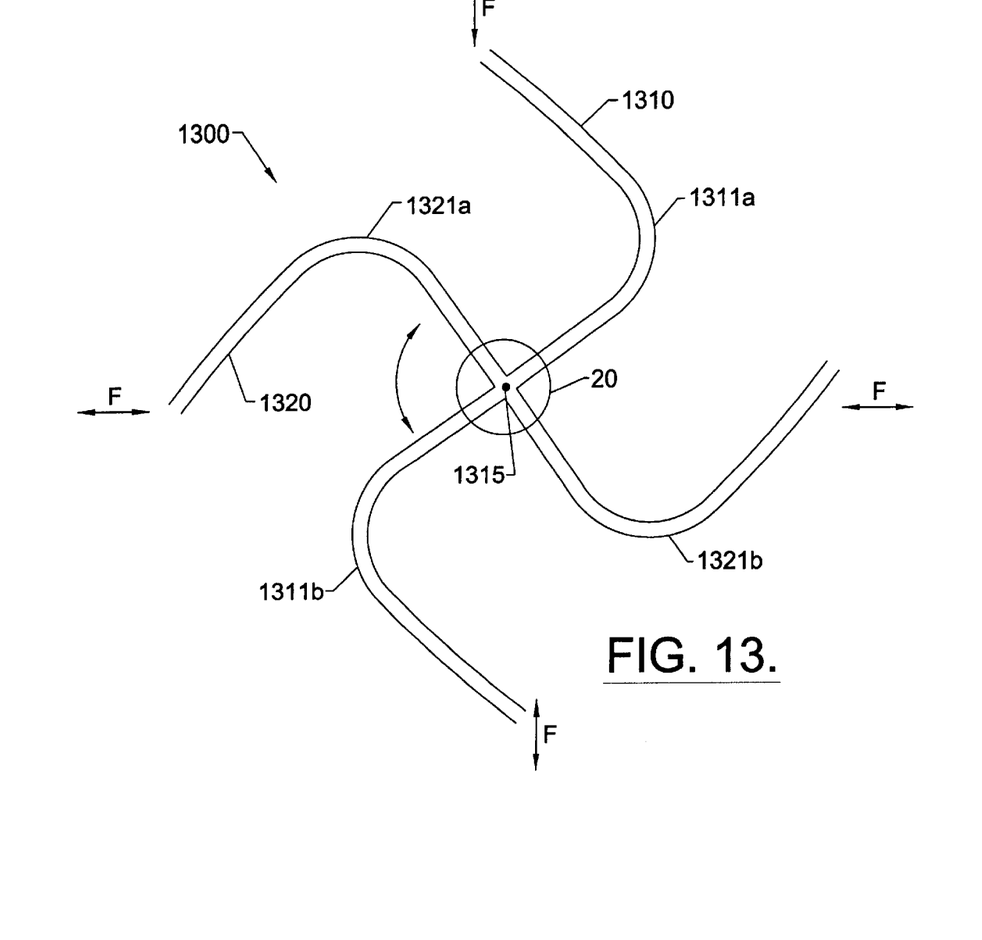

The configuration of FIG. 12 may be viewed as two-fold symmetric, and can be generalized to n-fold symmetric configurations. For example, FIG. 13 illustrates a four-fold symmetric rotary MEMS actuator 1300 according to other embodiments of the present invention, including first and second sine shaped beams 1310, 1320 that intersect at a point 1315 where oppositely inflected portions 1311a, 1311b, 1321a, 1321b of the beams 1310, 1320 meet. The beams 1310, 1320 are configured to engage an object of actuation 20 and are operative, responsive to compressive and/or tensile forces F applied thereto, to rotate the object of actuation 20 about the intersection point 1315. It will be appreciated that the beams 1310, 1320 may engage the object of actuation 20 in a number of different ways. For example, the beams 1310, 1320 may be fixedly attached to one another and/or to the objection of actuation 20 at or near the point of intersection 1315. The beams 1310, 1320 may also engage one another and/or the object of actuation 20 using a non-fixed arrangement, such as interlocking tabs or other surfaces. It will be appreciated that compressive and/or tensile forces F may be applied to the beams 1310, 1320 using various techniques, including by heating or cooling the beams 1310, 1320 to produce thermal contraction or expansion of the beams 1310, 1320. The beams 1310, 1320 may also be driven with other actuators, such as the actuators described with reference to FIGS. 10 and 11, to achieve larger rotations.

The actuator 1300 offers several potential advantages over conventional rotary actuator designs. For example, conventional rotary actuator designs may have more complex constituent components, such as springs, arms and axles, which may be more difficult to fabricate than the structure of FIG. 13. Conventional rotary actuator designs may also be less stable than the actuator 1300, which may capitalize on stabilizing properties of the shapes of the beams 1310, 1320. It will be understood that the present invention is not limited to the four-fold symmetric structure of FIG. 13, and can be generalized to n-fold symmetric combinations of more than two intersecting beams. There can be many uses for embodiments of MEMS actuators according to the present invention. For example, one of the linearly-acting cosine beam MEMS actuators described herein may be used to drive variable optical attenuators and/or optical cross-connect switching devices. A rotary sinusoidal MEMS actuator as described herein may be used, for example, to drive a rotating optical element such as a mirror. The actuators described herein may be also used in a wide variety of other applications, such as in microfluidic control or micropneumatic control applications.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:
1. A microelectromechanical actuator, comprising:
   a substrate; and
   a beam having respective first and second ends attached to the substrate and a body disposed between the first and second ends having a sinuous shape, the body including a portion operative to engage a object of actuation and apply a force thereto in a direction perpendicular to the beam responsive to at least one of a compressive force and a tensile force on the beam.
2. An actuator according to claim 1, wherein the sinuous shape is sinusoidal.
3. An actuator according to claim 2, wherein the sinuous shape approximates a single period of a cosine curve.
4. An actuator according to claim 3, wherein the body comprises a medial portion that moves parallel to the substrate responsive to compressive force and/or tensile force on the beam.
5. An actuator according to claim 2, wherein the sinuous shape approximates a single period of a sine curve.
6. An actuator according to claim 5, wherein the body comprises first and second portions that move in respective opposite first and second directions parallel to the substrate responsive to compressive force and/or tensile force on the beam.
7. An actuator according to claim 1, wherein the first and second ends of the beam are fixedly attached to the substrate.
8. An actuator according to claim 7, wherein the beam is operative to generate at least one of a compressive force and a tensile force responsive to a temperature of the beam.
9. An actuator according to claim 1, wherein at least one of the first and second ends are attached to the substrate by at least one movable support.
10. An actuator according to claim 9, wherein the at least one movable support is operative to apply at least one of a compressive force and a tensile force to the beam.
11. An actuator according to claim 10, wherein the at least one movable support comprises an actuator beam.
12. An actuator according to claim 1, wherein the sinuous shape approximates a bending mode shape of a straight beam.
13. An actuator according to claim 12, wherein sinuous shape is a continuous approximation of the bending mode shape.
14. An actuator according to claim 12, wherein the sinuous shape is a piecewise approximation of the bending mode shape.
15. A microelectromechanical actuator, comprising:
   a substrate; and
   a beam having respective first and second ends attached to the substrate and a body disposed between the first and second ends, the body including a portion operative to engage a object of actuation and apply a force thereto in a direction perpendicular to the beam responsive to at least one of a compressive force and a tensile force on the beam, the beam configured such that the body assumes a sinuous shape if freed from the substrate.
16. An actuator according to claim 15, wherein the sinuous shape is sinusoidal.
17. An actuator according to claim 16, wherein the sinuous shape approximates a single period of a cosine curve.
18. An actuator according to claim 17, wherein the body comprises a medial portion that moves parallel to the substrate responsive to compressive force and/or tensile force on the beam.
19. An actuator according to claim 16, wherein the sinuous shape approximates a single period of a sine curve.

20. An actuator according to claim 19, wherein the body comprises first and second portions that move in respective opposite first and second directions parallel to the substrate responsive to compressive force and/or tensile force on the beam.

21. An actuator according to claim 15, wherein the first and second ends of the beam are fixedly attached to the substrate.

22. An actuator according to claim 21, wherein the beam is operative to generate at least one of a compressive force and a tensile force responsive to a temperature of the beam.

23. An actuator according to claim 15, wherein at least one of the first and second ends are attached to the substrate by at least one movable support.

24. An actuator according to claim 23, wherein the at least one movable support is operative to apply at least one of a compressive force and a tensile force to the beam.

25. An actuator according to claim 24, wherein the at least one movable support comprises a beam structure.

26. An actuator according to claim 15, wherein the beam is configured such that the body assumes a shape approximating a bending mode shape if the body is freed from the substrate.

27. An actuator according to claim 26, wherein the beam is configured such that the body assumes a shape that is a continuous approximation of the bending mode shape if the body is freed from the substrate.

28. An actuator according to claim 26, wherein the beam is configured such that the body assumes a shape that is a piecewise approximation of the bending mode shape if the body is freed from the substrate.

29. A microelectromechanical rotary actuator, comprising:
   a substrate; and
   a beam having first and second ends attached to the substrate and a body disposed between the first and second ends, the body including first and second oppositely inflected portions meeting at a point between the first and second ends, the body operative to engage an object of actuation and rotate the object of actuation around the point at which the oppositely inflected portions meet responsive to at least one of a compressive force and a tensile force on the beam.

30. An actuator according to claim 29, wherein the first and second oppositely inflected portions are curved.

31. An actuator according to claim 30, wherein the body has a sinusoidal shape.

32. An actuator according to claim 31, wherein the body has a shape approximating a single period of a sine curve.

33. An actuator according to claim 29, wherein the beam comprises first and second beams, a respective one of which has first and second ends attached to the substrate and a body disposed between the first and second ends, each body including first and second oppositely inflected portions meeting at a point between the first and second ends, wherein the bodies of the first and second beams intersect one another at the points at which the first and second oppositely inflected portions of the bodies of the first and second beams meet and wherein the bodies of the first and second beams are operative to engage the object of actuation and rotate the object of actuation around the point at which the bodies of the first and second beams intersect responsive to at least one of compressive force and tensile force on the first and second beams.

34. A microelectromechanical rotary actuator, comprising:
   a substrate; and
   a beam having first and second ends attached to the substrate and a body disposed between the first and second ends, the body having a shape corresponding to a period of a sine curve, the body operative to engage an object of actuation and rotate the object of actuation responsive to at least one of a compressive force and a tensile force on the beam.

35. An actuator according to claim 34, wherein the beam comprises first and second beams, a respective one of which has first and second ends attached to the substrate and a body disposed between the first and second ends, each body having a shape approximating a period of a sine curve, wherein the bodies of the first and second beams intersect one another at inflection points of the bodies of the first and second beams, and wherein the bodies of the first and second beams are operative to engage the object of actuation and rotate the object of actuation around the point at which the bodies of the first and second beams intersect responsive to at least one of compressive force and tensile force on the first and second beams.

36. A microstructure, comprising:
   a substrate;
   a sacrificial layer on the substrate;
   a beam having respective first and second ends attached to the substrate and a sinusoidal body disposed between the first and second ends and on the sacrificial layer.

37. A microstructure according to claim 36, wherein the sinusoidal body has a shape approximating a period of a cosine curve.

38. A microstructure according to claim 36, wherein the sinusoidal body has a shape approximating a period of a sine curve.

39. A microstructure, comprising:
   a substrate;
   a sacrificial layer on the substrate; and
   a beam having respective first and second ends attached to the substrate and a body disposed between the first and second ends and disposed on the sacrificial layer, the body having a shape approximating a bending mode shape.

40. A microstructure according to claim 39, wherein the shape of the body is a substantially continuous approximation of the bending mode shape.

41. A microstructure according to claim 39, wherein the shape of the body is a piecewise approximation of the bending mode shape.

42. A microstructure according to claim 39, wherein the shape of the body approximates a period of a sine curve.

43. A microstructure according to claim 39, wherein the shape of the body approximates a period of a cosine curve.

44. A method of fabricating a microstructure, the method comprising:
   forming a sacrificial layer on a substrate;
   forming a beam having respective first and second ends attached to the substrate and a sinusoidal body disposed between the first and second ends and on the sacrificial layer;
   removing at least a portion of the sacrificial layer to release the sinusoidal body.

45. A method according to claim 44, wherein the sinusoidal body has a shape approximating a period of a cosine curve.

46. A method according to claim 44, wherein the sinusoidal body has a shape approximating a period of a sine curve.

47. A method according to claim 44, wherein the step of forming a beam comprises:

forming a layer on the sacrificial layer; and patterning the layer to form the beam.

48. A method of fabricating a microstructure, the method comprising:

forming a sacrificial layer on a substrate;

forming a beam having respective first and second ends attached to the substrate and a body disposed between the first and second ends and disposed on the sacrificial layer, the body having a shape approximating a bending mode shape.

49. A method according to claim 48, wherein the shape of the body is a substantially continuous approximation of the bending mode shape.

50. A method according to claim 48, wherein the beam shape is a piecewise approximation of the bending mode shape.

51. A method according to claim 48, wherein the shape of the body approximates a period of a sine curve.

52. A method according to claim 48, wherein the shape of the body approximates a period of a cosine curve.

53. A method according to claim 48, wherein the step of forming a beam comprises:

forming a layer on the sacrificial layer; and patterning the layer to form the beam.

54. A method of rotating an object of actuation, the method comprising:

engaging the object of actuation with a beam having first and second ends attached to a substrate and a body disposed between the first and second ends, the body including first and second oppositely inflected portions meeting at a point between the first and second ends; and applying one of a compressive force or a tensile force to the beam to rotate the object of actuation around the point at which the oppositely inflected portions meet.

55. A method according to claim 54, wherein the first and second oppositely inflected portions are curved.

56. A method according to claim 55, wherein the body has a sinusoidal shape.

57. A method according to claim 56, wherein the body has a shape approximating a single period of a sine curve.

58. A method according to claim 54:

wherein the step of engaging comprises the step of engaging the object of actuation with first and second beams, a respective one of which has first and second ends attached to the substrate and a body disposed between the first and second ends, each body including first and second oppositely inflected portions meeting at a point between the first and second ends, wherein the bodies of the first and second beams intersect one another at the points at which the first and second oppositely inflected portions of the first and second bodies meet; and wherein said step of applying comprises the step of applying respective compressive or tensile forces to the first and second beams to rotate the object of actuation around the point at which the first and second bodies intersect.

* * * * *